US007011922B2

(12) United States Patent
Minami et al.

(10) Patent No.: US 7,011,922 B2
(45) Date of Patent: Mar. 14, 2006

(54) THERMAL RECORDING MATERIAL

(75) Inventors: Kazumori Minami, Shizuoka-ken (JP); Hisao Yamada, Shizuoka-ken (JP); Hiroshi Sato, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/367,974

(22) Filed: Feb. 19, 2003

(65) Prior Publication Data

US 2004/0161693 A1 Aug. 19, 2004

(51) Int. Cl.
*G03F 7/021* (2006.01)
*B41M 5/30* (2006.01)

(52) U.S. Cl. ...................... 430/138; 430/157; 430/181; 503/215; 503/216; 503/217

(58) Field of Classification Search ............ 430/270.1, 430/302, 138, 157, 151, 177, 160, 162, 181; 503/214, 215, 216, 217
See application file for complete search history.

(56) References Cited

U.S. PATENT DOCUMENTS

| | | | | |
|---|---|---|---|---|
| 4,420,538 A * | 12/1983 | Nakamura et al. | .......... | 503/209 |
| 4,540,999 A * | 9/1985 | Arai | .......... | 503/216 |
| 4,542,395 A * | 9/1985 | Saito et al. | .......... | 503/216 |
| 4,546,365 A * | 10/1985 | Brockett et al. | .......... | 503/214 |
| 4,585,483 A | 4/1986 | Ikeda et al. | | |
| 4,742,043 A * | 5/1988 | Tanaka et al. | .......... | 503/213 |
| 4,803,192 A * | 2/1989 | Saeki et al. | .......... | 503/212 |
| 4,857,502 A * | 8/1989 | Ueda et al. | .......... | 503/217 |
| 4,939,116 A * | 7/1990 | Ueda et al. | .......... | 503/204 |
| 5,272,127 A * | 12/1993 | Mandoh et al. | .......... | 503/207 |
| 5,278,021 A | 1/1994 | Jeffries, III et al. | | |
| 5,283,374 A * | 2/1994 | Jeffries, III | .......... | 430/191 |
| 5,679,615 A * | 10/1997 | Matsumoto et al. | .......... | 503/217 |
| 6,197,724 B1 * | 3/2001 | Aono | .......... | 503/209 |
| 6,310,002 B1 * | 10/2001 | Krzoska et al. | .......... | 503/213 |
| 6,352,812 B1 * | 3/2002 | Shimazu et al. | .......... | 430/273.1 |
| 6,660,689 B1 * | 12/2003 | Serizawa et al. | .......... | 503/226 |
| 6,667,275 B1 * | 12/2003 | Sano et al. | .......... | 503/200 |
| 6,716,793 B1 * | 4/2004 | Kubota et al. | .......... | 503/209 |
| 6,727,203 B1 * | 4/2004 | Ichikawa | .......... | 503/215 |
| 2004/0171485 A1 * | 9/2004 | Nagai et al. | .......... | 503/201 |

FOREIGN PATENT DOCUMENTS

| | | |
|---|---|---|
| JP | 4-20792 B | 4/1992 |
| JP | 6-242599 A | 9/1994 |
| JP | 07-117355 A | 5/1995 |
| JP | 08-276654 A | 10/1996 |
| JP | 10-250237 A | 9/1998 |
| JP | 11-020314 A | 1/1999 |
| JP | 2000-63308 A | 2/2000 |
| JP | 2000-063308 A | 2/2000 |
| JP | 2002-59661 A | 2/2002 |

* cited by examiner

*Primary Examiner*—John S. Chu
(74) *Attorney, Agent, or Firm*—Sughrue Mion, PLLC

(57) ABSTRACT

The present invention provides a thermal recording material comprising a support and at least a thermal recording layer disposed on the support, wherein at least one of the thermal recording layer includes, together with an electron donating colorless dye, at least an electron accepting compound represented by the following general formula (1). $R^1$ and $R^2$ each independently represents a hydrogen atom, an alkyl group or an aryl group; and Ar is represented by the following general formula (2). In the general formula (2), $R^{11}$ to $R^{14}$ each independently represents a hydrogen atom, an alkyl group with 1 to 4 carbon atoms or an aryl group.

General formula (1)

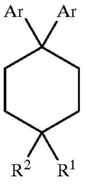

General formula (2)

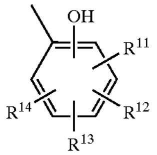

20 Claims, No Drawings

THERMAL RECORDING MATERIAL

BACKGROUND OF THE INVENTION

1. Field of the Invention

The present invention relates to a thermal recording material, and more particularly, to a thermal recording material excelling in image storability.

2. Description of the Related Art

Thermal recording materials are utilized in various fields because in general, they are inexpensive and recording equipment therefor is compact and requires little to no maintenance. As competition in the thermal recording material market has recently intensified, there is a demand for more advanced functionality that differs from the functions of conventional thermal recording materials. In order to meet that demand, intense research is being conducted in areas such as color developing density, image storability, and head matching in order to improve thermal recording materials.

In conventional thermal recording materials, 2,2-bis(4-hydroxyphenyl)propane (so-called "bisphenol-A") is widely employed as an electron accepting compound, which reacts with an electron donating colorless dye to induce a color development. However, none of the conventional thermal recording materials has ever succeeded in providing satisfying sensitivity, background fog, image storage property, chemical resistance and head matching (sticking), all at the same time.

Japanese Patent Application Bulletin (JP-B) No. 4-20792 discloses a recording material employing N-substituted sulfamoylphenol or N-substituted sulfamoylnaphthaol as the electron accepting compound and states that such a (pressure-sensitive or thermo-sensitive) recording material achieves improvements in image density, image stability and cost. Nonetheless, there is still room for much improvement in image storability.

SUMMARY OF THE INVENTION

The present invention is to solve the aforementioned drawbacks and to provide a thermal recording material which shows an excellent image storability in a light place.

As a result of intensive investigations of an electron accepting compound for the development of an excellent thermal recording material, the present inventors have made the present invention.

The above-mentioned objective of the invention is attained in the following manner.

A first embodiment of the present invention is a thermal recording material comprising a support and at least a thermal recording layer disposed on the support, wherein at least one of the thermal recording layer includes, together with an electron donating colorless dye, at least an electron accepting compound represented by the following general formula (1):

General formula (1)

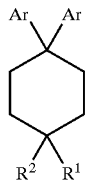

wherein $R^1$ and $R^2$ each independently represents a hydrogen atom, an alkyl group or an aryl group; and Ar is represented by the following general formula (2):

General formula (2)

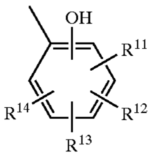

wherein $R^{11}$ to $R^{14}$ each independently represents a hydrogen atom, an alkyl group with 1 to 4 carbon atoms or an aryl group.

A second embodiment of the present invention is the thermal recording material, according to the first embodiment, wherein at least one of $R^1$ and $R^2$ in the general formula (1) is a substituent represented by the following general formula (3):

General formula (3)

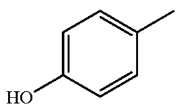

A third embodiment of the present invention is the thermal recording material, according to the first embodiment, wherein the compound represented by the general formula (1) is at least one selected from a group consisting of following compounds 1 to 15:

General formula (1)
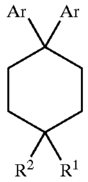
| Compound No. | $R^1$ | $R^2$ | Ar |
|---|---|---|---|
| 1 | —H | —H | 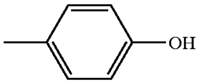 |
| 2 | —H | —H | 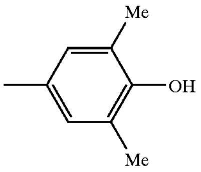 |
| 3 | —H | —H | 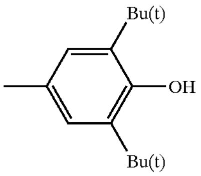 |
| 4 | —H | —Me | 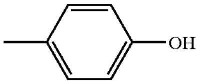 |
| 5 | —H | —Bu(t) | 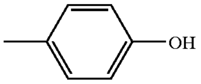 |
| 6 | —H | —Oct(t) | 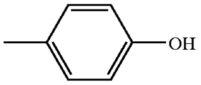 |
| 7 | —H | —Bu(t) | 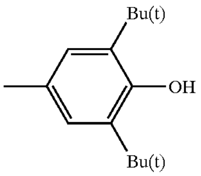 |
| 8 | —H | 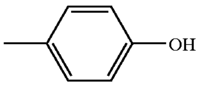 | 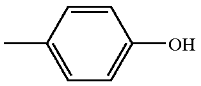 |
| 9 | —H | 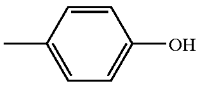 | 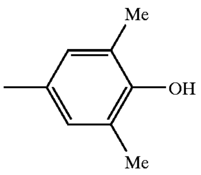 |

-continued

General formula (1)

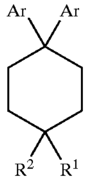

| Compound No. | $R^1$ | $R^2$ | Ar |
|---|---|---|---|
| 10 | —H | 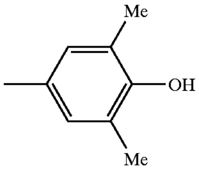 | 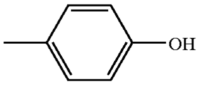 |
| 11 | —H | 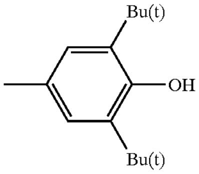 | 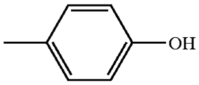 |
| 12 | —H | 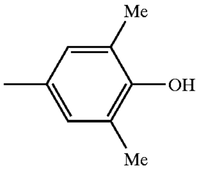 | 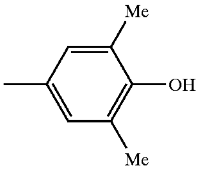 |
| 13 | —H | 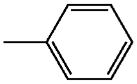 | 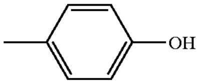 |
| 14 | —H | 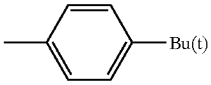 | 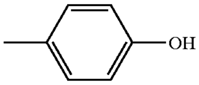 |
| 15 | 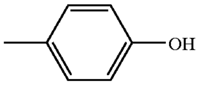 | 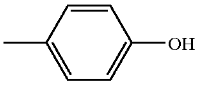 | 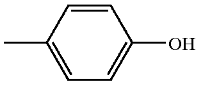 |

A fourth embodiment of the present invention is the thermal recording material, according to the first embodiment, wherein the electron donating colorless dye is enclosed in microcapsules.

A fifth embodiment of the present invention is the thermal recording material, according to the fourth embodiment, wherein a wall membrane of the microcapsules includes at least one selected from the group consisting of polyurethane resins, polyurea resins, polyamide resins, polyester resins, polycarbonate resins, aminoaldehyde resins, melamine resins, polystyrene resins, styrene-acrylate copolymer resins, styrene-methacrylate copolymer resins, gelatins and polyvinyl alcohols.

A sixth embodiment of the present invention is the thermal recording material, according to the fourth embodiment, wherein the microcapsules have an average particle size of 0.1 to 5.0 $\mu$m.

A seventh embodiment of the present invention is the thermal recording material, according to the first embodiment, wherein the electron donating colorless dye includes at least one selected from a group consisting of a triarylmethane compound, a diphenylmethane compound, a thiazine compound, a xanthene compound and a spiropyran compound.

An eighth embodiment of the present invention is the thermal recording material, according to the first embodiment, wherein the electron donating colorless dye in the thermal recording layer possesses a solid coating amount of 0.01 to 2.0 g/$m^2$.

A ninth embodiment of the present invention is the thermal recording material, according to the first embodiment, wherein the electron accepting compound includes at least one selected from a group consisting of a phenol derivative and a hydroxybenzoic acid ester.

A tenth embodiment of the present invention is the thermal recording material, according to the first embodiment, wherein the electron accepting compound in the thermal recording layer possesses a solid coating amount of 0.5 to 10.0 $g/m^2$.

An eleventh embodiment of the present invention is the thermal recording material, according to the first embodiment, comprising at least one photo-fixable thermal recording layer disposed on the support, said photo-fixable thermal recording layer including a diazonium salt compound, a diazo color developing agent including a coupler capable of a coupling reaction with said diazonium salt compound, and a binder.

A twelfth embodiment of the present invention is the thermal recording material, according to the eleventh embodiment, wherein the diazonium salt compound is enclosed in microcapsules.

A thirteenth embodiment of the present invention is the thermal recording material, according to the twelfth embodiment, wherein a wall membrane of the microcapsules includes at least one selected from a group consisting of polyurethane resins, polyurea resins, polyamide resins, polyester resins, polycarbonate resins, aminoaldehyde resins, melamine resins, polystyrene resins, styrene-acrylate copolymer resins, styrene-methacrylate copolymer resins, gelatins and polyvinyl alcohols.

A fourteenth embodiment of the present invention is the thermal recording material, according to the twelfth embodiment, wherein the microcapsules have an average particle size of 0.1 to 5.0 $\mu$m.

A fifteenth embodiment of the present invention is the thermal recording material, according to the eleventh embodiment, wherein the photo-fixable thermal recording layer further includes a basic substance.

A sixteenth embodiment of the present invention is the thermal recording material, according to the first embodiment, further comprising, on the support, at least one each of an optical transmittance regulating layer, a protective layer and an intermediate layer A seventeenth embodiment of the present invention is the thermal recording material, according to the sixteenth embodiment, wherein the optical transmittance regulating layer includes an ultraviolet absorber precursor.

An eighteenth embodiment of the present invention is the thermal recording material, according to the sixteenth embodiment, wherein the intermediate layer includes at least one selected from a group consisting of polyvinyl alcohols, denatured polyvinyl alcohols, methyl cellulose, sodium polystyrenesulfonate, a styrene-maleic acid copolymers, gelatins, a gelatin derivatives, polyethylene glycols and a polyethylene glycol derivatives.

A nineteenth embodiment of the present invention is the thermal recording material, according to the sixteenth embodiment, wherein the protective layer includes at least one selected from a group consisting of denatured polyvinyl alcohols, a silicone-denatured polyvinyl alcohol polymers, carboxylmethyl cellulose and hydroxyethyl cellulose.

A twentieth embodiment of the present invention is the thermal recording material, according to the first embodiment, wherein the support has at least one in a layer form selected from a group consisting of a polyester film, a cellulose derivative film, a polyolefin film, a polyimide film, a polyvinyl chloride film, a polyvinylidene chloride film, a polyacrylic acid copolymer film, a polycarbonate film, paper and synthetic paper.

DESCRIPTION OF THE PREFERRED EMBODIMENTS

The thermal recording material of the present invention comprises a support and at least a thermal recording layer disposed on the support, wherein at least one of the thermal recording layer includes, together with an electron donating colorless dye, at least an electron accepting compound represented by the aforementioned general formula (1).

In the following, there will be given a more detailed description on the thermal recording material of the invention.

Thermal Recording Layer

In the present invention, at least one of the thermal recording layer includes, together with an electron donating colorless dye, at least an electron accepting compound represented by the aforementioned general formula (1), and there may also be provided another thermal recording layer. In the following there will be given an explanation on the thermal recording layer of the invention.

The electron donating colorless dye is not particularly limited and can be selected from already known substances according to the purpose, and, in the invention, there can be employed an electron donating colorless dye precursor.

The electron donating colorless dye precursor can be, for example, a triarylmethane compound, a diphenylmethane compound, a thiazine compound, a xanthene compound or a spiropyran compound. Such compounds may be employed singly or in a combination of two or more kinds, and, among these compounds, a triarylmethane compound and a xanthene compound are preferred because these compounds have a high developed color density and are useful. Examples of these compounds include 3,3-bis(p-dimethylaminophenyl)-6-dimethylamino phthalide (namely crystal violet lactone), 3,3-bis(p-dimethylamino)phthalide, 3-(p-dimethylaminophenyl)-3-(1,3-dimethylindol-3-yl)phthalide, 3-(p-dimethylaminophenyl)-3-(2-methylindol-3-yl)phthalide, 3-(o-methyl-p-dimethylaminophenyl)-3-(2-methylindol-3-yl)phthalide, 4,4'-bis(dimethylamino) benzhydrin benzyl ether, N-halophenyl leucoauramin, N-2,4,5-trichlorophenyl leucoauramin, rhodamin-B-anilinolactam, rhodamin(p-nitroanilino)lactam, rhodamin-B-(p-chloroanilino)lactam, 2-benzylamino-6-diethylaminofluoran, 2-anilino-6-diethylaminofluoran, 2-anilino-3-methyl-6-diethylaminofluoran, 2-anilino-3-methyl-6-cyclohexylmethylaminofluoran, 2-anilino-3-methyl-6-isoamylethylaminofluoran, 2-(o-chloroanilino)-6-diethylaminofluoran, 2-octylamino-6-diethylaminofluoran, 2-ethoxyethylamino-3-chloro-2-diethylaminofluoran, 2-anilino-3-chloro-6-diethylaminofluoran, benzoyl leuco methylene blue, p-nitrobenzyl leuco methylene blue, 3-methyl-spiro-dinaphthopyran, 3-ethyl-spiro-dinaphthopyran, 3,3'-dichloro-spiro-dinaphthopyran, 3-benzyl-spiro-dinaphthopyran, and 3-propyl-spiro-dibenzopyran.

A coating amount of the electron donating colorless dye is not particularly limited, but is preferably within a range of 0.01 to 2.0 $g/m^2$ in solid coating amount, more preferably 0.1 to 0.6 $g/m^2$.

At least one of the thermal recording layers in the invention includes at least an electron accepting compound, which is explained below, represented by a following general formula (1):

General formula (1)

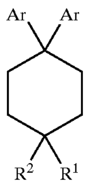

In the general formula (1), $R^1$ and $R^2$ each independently represents a hydrogen atom, an alkyl group or an aryl group and preferably is an alkyl group or an aryl group.

In the general formula (1), the alkyl group represented by $R^1$ and $R^2$ is preferably an alkyl group with 1 to 20 carbon atoms in consideration of a color developing property, more preferably an alkyl group with 1 to 10 carbon atoms and most preferably an alkyl group with 1 to 4 carbon atoms. Also the alkyl group represented by $R^1$ and $R^2$ may be straight-chained, ramified or may form a cyclic ring.

In the general formula (1), the aryl group represented by $R^1$ and $R^2$ can be, for example, a phenyl group or a naphthyl group and may further have a substituent. A substituent on such aryl group can be a hydroxyl group or an alkyl group with 1 to 10 carbon atoms, and such alkyl group substituting the aryl group may be straight-chained or ramified. The substituent for the aryl group is preferably a hydroxyl group or an alkyl group with 1 to 4 carbon atoms in consideration of the color developing property, and more preferably a hydroxyl group.

In the general formula (1), Ar is represented by a following general formula (2):

General formula (2)

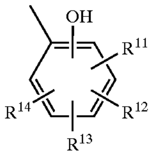

In the general formula (2), $R^{11}$ to $R^{14}$ each independently represents a hydrogen atom, an alkyl group with 1 to 4 carbon atoms or an aryl group.

The alkyl group with 1 to 4 carbon atoms represented by $R^{11}$ to $R^{14}$ may be straight-chained or ramified.

The aryl group represented by $R^{11}$ to $R^{14}$ can be, for example, a phenyl group or a naphthyl group, among which preferred is a phenyl group. Also the aryl group represented by $R^{11}$ to $R^{14}$ may further have a substituent, and the substituent for the aryl group can be, for example, an alkyl group or a hydroxyl group.

In the electron accepting compound represented by the general formula (1), it is preferred that at least either of $R^1$ and $R^2$ in the general formula (1) is a substituent represented by a following general formula (3):

General formula (3)

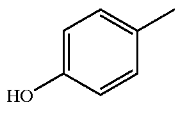

In the following there will be shown specific examples of the electron accepting compound represented by the general formula (1), but the present invention is not limited by such specific examples.

TABLE 1

| Compound No. | $R^1$ | $R^2$ | Ar |
|---|---|---|---|
| 1 | —H | —H | 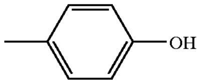 |
| 2 | —H | —H | 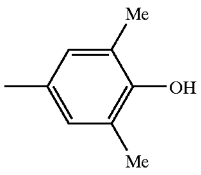 |
| 3 | —H | —H | 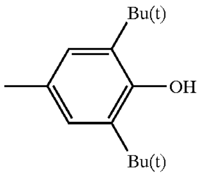 |
| 4 | —H | —Me | 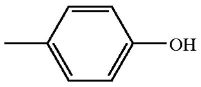 |
| 5 | —H | —Bu(t) | 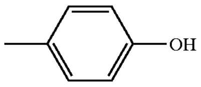 |
| 6 | —H | —Oct(t) | 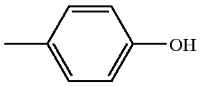 |
| 7 | —H | —Bu(t) | 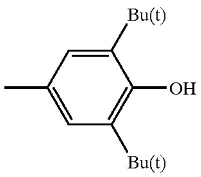 |
| 8 | —H | 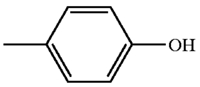 | 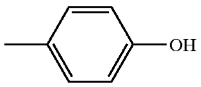 |

TABLE 2

| Compound No. | $R^1$ | $R^2$ | Ar |
|---|---|---|---|
| 9 | —H | 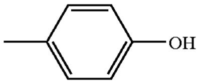 | 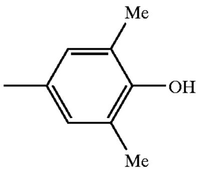 |
| 10 | —H | 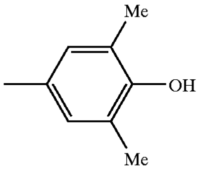 | 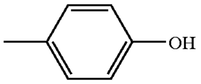 |
| 11 | —H | 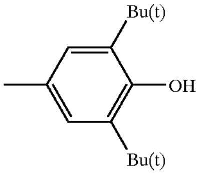 | 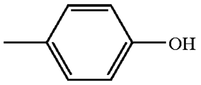 |
| 12 | —H | 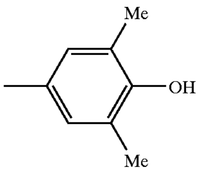 | 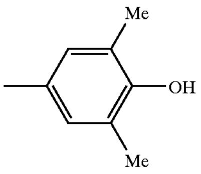 |
| 13 | —H | 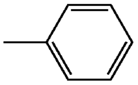 | 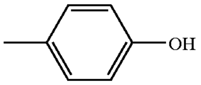 |
| 14 | —H | 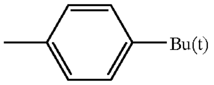 | 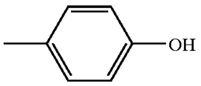 |
| 15 | 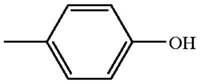 | 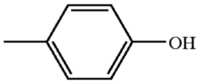 | 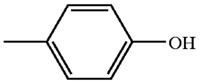 |

In the thermal recording material of the invention, it is possible to use, in addition to the electron accepting compound represented by the general formula (1), an already known electron accepting compound in combination, within an extent not affecting the effect of the invention.

Such already known electron accepting compound can be a phenol derivative or a hydroxybenzoic acid ester. Among these, particularly preferred is a bisphenol, and particularly preferred examples include: 2,2-bis(p-hydroxyphenyl)propane (namely bisphenol-A), 4,4'-(p-phenylenediisopropylidene)diphenyl (namely bisphenol-P), 2,2-bis(p-hydroxylphenyl)pentane, 2,2-bis(p-hydroxyphenyl)ethane, 2-2-bis (p-hydroxyphenyl)butane, 2,2-bis(4'-hydroxy-3',5'-dichlorophenyl)propane, 1,1-(p-hydroxyphenyl) cyclohexane, 1,1-(p-hydroxyphenyl)propane, 1,1-(p-hydroxylphenyl)pentane, 1,1-(p-hydroxyphenyl)-2-ethylhexane, butyl p-hydroxybenzoate, benzyl p-hydroxybenzoate, 2-ethylhexyl p-hydroxybenzoate, p-phenylphenol and p-cumylphenol.

A coating amount of the electron accepting compound represented by the general formula (1) is not particularly limited, but preferably within a range of 0.5 to 10.0 $g/m^2$ in solid coating amount, more preferably 1.0 to 5.0 $g/m^2$.

In the thermal recording material of the invention, in case of having plural thermal recording layers, there have to be employed color developing agents with different energies for color development. Also the thermal recording material of the invention may be so constructed as to provide a single color or full colors, but it is desired to have, in addition to the thermal recording layer containing the aforementioned electron donating colorless dye and the electron accepting compound represented by the general formula (1), at least a thermal recording layer (photo-fixable thermal recording layer) principally including a diazonium salt compound, a diazo color developing agent containing a coupler capable of a coupling reaction with the diazonium salt compound, and a binder.

As a color developing agent in such thermal recording layer, there may also be employed, in addition to the diazo color developing agent, a base color developing system which develops a color by contact with a basic substance, a chelate color developing system, or a color developing system which reacts with a nucleophilic substance to cause a cleavage reaction thereby developing a color.

In case the thermal recording layer includes the above-mentioned diazonium salt compound and the coupler which reacts with the diazonium salt compound in a heated state to develop a color, there is advantageously added, in the thermal recording layer, a basic substance or the like capable of accelerating the color developing reaction of the diazonium salt compound and the coupler.

The diazonium salt compound is a compound represented by a following general formula (B), and a maximum absorption wavelength thereof can be controlled by a position and a type of a substituent in a portion Ar:

$A\text{-}N_2^+X^-$ General formula (B)

wherein A represents an aryl group, and $X^+$ represents an acid anion.

Specific examples of the diazonium salt compound include acid anion salts such as:

4-(N-(2-(2,4-di-tert-amylphenoxy)butyryl)piperadino)benzene diazonium, 4-dioctylaminobenzene diazonium, 4-(N-(2-ethylhexanoyl)piperadino)benzene diazonium, 4-dihexylamino-2-hexyloxybenzene diazonium, 4-N-ethyl-N-hexadecylamino-2-ethoxybenzo diazonium, 3-chloro-4-dioctylamino-2-octyloxybenzene diazonium, 2,5-dibutoxy-4-morpholinobenzene diazonium, 2,5-dioctoxy-4-morpholinobenzene diazonium, 2,5-dibutoxy-4-(N-(2-ethylhexanoyl)piperadino)benzene diazonium, 2,5-diethoxy-4-(N-(2-(2,4-di-tert-amylphenoxy)butyryl)-piperadino)benzene diazonium, 2,5-dibutoxy-4-tollylthiobenzene diazonium, or 3-(2-octyloxyethoxy)-4-morpholinobenzene diazonium, and following diazonium salt compounds (D-1 to D-5). These compounds may be used singly or in a combination of two or more kinds.

Among these, particularly preferred are a hexafluorophosphate salt, a tetrafluoroborate salt and a 1,5-naphthalenesulfonate salt.

D-1

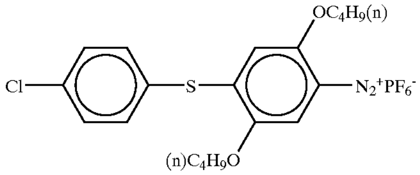

D-2

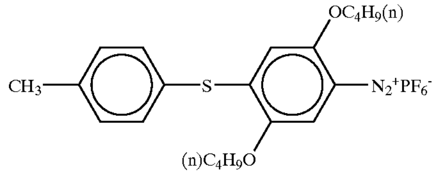

D-3

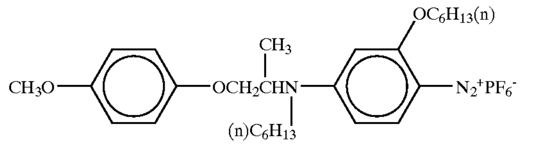

-continued

D-4

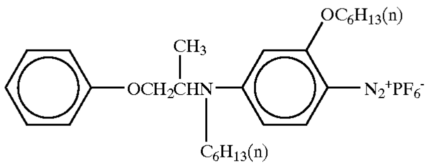

D-5

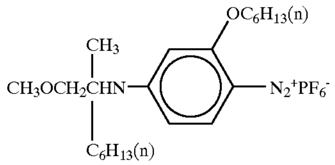

Among these diazonium salt compounds, particularly preferred are those decomposable by a light of a wavelength of 300 to 400 nm, which are 4-(N-(2-(2,4-di-tert-amylphenoxy)butyryl)piperadino)benzene diazonium, 4-dioctylaminobenzene diazonium, 4-(N-(2-ethylhexanoyl)piperadino) benzene diazonium, 4-dihexylamino-2-hexyloxybenzene diazonium, 4-N-ethyl-N-hexadecylamino-2-ethoxybenzo diazonium, 5-dibutoxy-4-(N-(2-ethylhexanoyl)piperadino) benzene diazonium, 2,5-diethoxy-4-(N-(2-(2,4-di-tert-amylphenoxy)butyryl)piperadino)benzene diazonium, and and the diazonium salt compounds D-3 to D-5.

The maximum absorption wavelength of the diazonium salt compound is obtained by a measurement of each diazonium salt compound in a coated film of a coating amount of 0.1 to 1.0 $g/m^2$, with a spectrophotometer (Shimadzu MPS-2000).

Examples of the coupler capable of color development by reaction with the diazonium salt compound in a heated state include resorcin, phloroglucin, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfanylnaphthalene, 2-hydroxy-3-naphthoic acid anilide, 2-hydroxy-3-naphthoic acid ethanolamide, 2-hydroxy-3-naphthoic acid octylamide, 2-hydroxy-3-naphthoic acid N-dodecyloxypropylamide, 2-hydroxy-3-naphthoic acid tetradecylamide, acetanilide, acetacetanilide, benzoylacetanilide, 2-chloro-5-octylacetacetanilide, 1-phenyl-3-methyl-5-pyrazolone, 1-(2'-octylphenyl)-3-methyl-5-pyrazolone, 1-(2',4',6'-trichlorophenyl)-3-benzamide-5-pyrazolone, 1-(2',4',6'-trichlorophenyl)-3-anilino-5-pyrazolone, 1-phenyl-3-phenylacetamide-5-pyrazolone, and following compounds (C-1 to C-6). These couplers may be used singly or in a combination of two or more kinds.

C-1

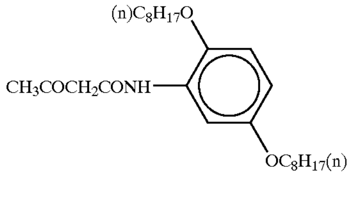

-continued

C-2

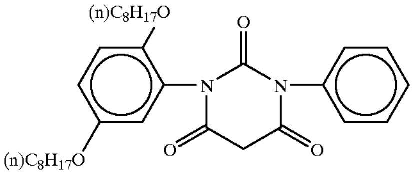

C-3

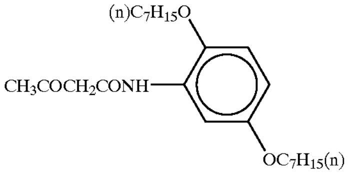

C-4

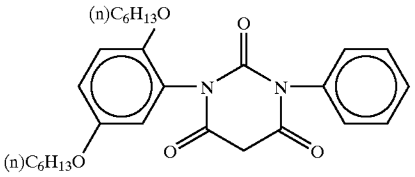

C-5

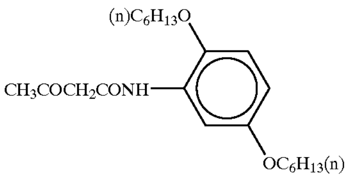

C-6

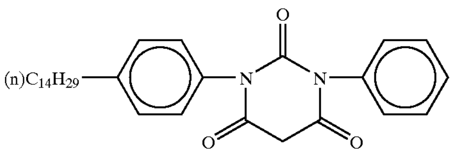

The basic substance is not particularly limited but can be suitably selected from those already known according to the purpose, which include not only inorganic and organic basic compounds but also a compound capable of releasing an alkali substance under heating for example by a decomposition. Representative examples of such compound include a nitrogen-containing compound such as an organic ammonium salt, an organic amine, an amide, urea and thiourea and a derivative thereof, a thiazole, a pyrrole, a pyrimidine, a piperadine, a guanidine, an indol, an imidazole, an imidazoline, a triazole, a morpholine, a piperidine, an amidine, a formazine or a pyridine.

Specific examples of such compound include tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-dicyclohexylguanidine, 1,2,3-tricyclohexylguanidine, guanidine trichloroacetic acid salt, N,N'-dibenzylpiperadine, 4,4'-dithiomorpholine, morpholine trichloroacetic acid salt, 2-aminobenzothiazole, and 2-benzoylhydrazinobenzothiazole. These compounds may be used singly or in a combination of two or more kinds.

For the binder to be used in the thermal recording layer, there can be employed a known water-soluble polymer compound or a latex. Examples of the water-soluble polymer compound include methyl cellulose, carboxymethyl cellulose, hydroxyethyl cellulose, hydroxypropyl cellulose, a starch derivative, casein, gum Arabic, an ethylene-maleic anhydride copolymer, styrene-maleic anhydride copolymer, polyvinyl alcohol, epichlorohydrin-denatured polyamide, an isobutylene-maleic salicylic anhydride copolymer, polyacrylic acid, polyacrylamide and denatured products thereof, and examples of the latex include styrene-butadiene rubber latex, methyl acrylate-butadiene rubber latex and a vinyl acetate emulsion.

Also in order to improve the fastness of a color developed image against light and heat, or to reduce a yellow coloration in an unprinted part (non-image area) after fixation, it is preferable to employ a known antioxidant shown in the following.

Examples of the antioxidant include those described in EP-A Nos. 223739, 309401, 309402, 310551, 310552 and 459416, GP-A No.3435443, JP-A Nos. 54-48535, 62-262047, 63-113536, 63-163351, 2-262654, 2-71262, 3-121449, 5-61166, and 5-119449, U.S. Pat. Nos. 4,814,262 and 4,980,275.

In the thermal recording layer of the invention, the mode of inclusion of the electron donating colorless dye, the electron accepting compound, the diazonium salt compound, the coupler and the basic substance is not particularly limited but can be suitable selected according to the purpose. For example, these components may be included by (1) a method of dispersion in solid, (2) a method of dispersion by emulsification, (3) a method of dispersion in polymer, (4) a method of dispersion in latex, or (5) a method of inclusion in microcapsules.

Among these methods, there is preferred a method of inclusion in the thermal recording layer by inclusion in microcapsules, in consideration of the storability. In particular, the electron donating colorless dye is preferably included by inclusion in the microcapsules. Also in case of a thermal recording layer including the diazonium salt compound and the coupler, the diazonium salt compound is preferably included by inclusion in the microcapsules.

For including the electron donating colorless dye in the microcapsules, there can be utilized already known microencapsulating methods. More specifically, the electron donating colorless dye can be prepared by dissolving the electron donating colorless dye precursor and a microcapsule wall precursor in an organic solvent which is insoluble or low-soluble in water, adding and dispersing an obtained solution in an aqueous solution of a water-soluble polymer into an emulsion, and elevating the temperature thereby forming a polymer substance as a microcapsule wall at the oil/water interface.

The wall membrane of the microcapsules of the invention can be formed for example from polyurethane resin, polyurea resin, polyamide resin, polyester resin, polycarbonate resin, aminoaldehyde resin, melamine resin, polystyrene resin, styrene-acrylate copolymer resin, styrene-methacrylate copolymer resin, gelatin, or polyvinyl alcohol. Among these, a wall membrane formed from polyurethane-polyurea resin is preferred.

In case the microcapsules have the wall membrane formed by polyurethane-polyurea resin, such microcapsules can be prepared by mixing a microcapsule wall precursor such as a polyvalent isocyanate in a core material to be encapsulated, dispersing and emulsifying such core material in an aqueous solution of a water-soluble polymer such as polyvinyl alcohol, and elevating the liquid temperature to induce a polymer forming reaction at the interface of oil droplets.

Examples of the polyvalent isocyanate include a diisocyanate such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene1,2-diisocyanate or cyclohexylene-1,4-diisocyanate; a triisocyanate such as 4,4',4"-triphenylmethane triisocyanate, or toluene-2,4,6-triisocyanate; a tetraisocyanate such as 4,4'-dimethyldiphenylmethane-2,2',5,5'-tetraisocyanate; and an isocyanate prepolymer such as an addition product of hexamethylene diisocyanate and trimethylolpropane, an addition product of 2,4-tolylene diisocyanate and trimethylolpropane, an addition product of xylilene diisocianate and trimethylolpropane or an addition product of tolylenediisocyanate and hexanetriol. These compounds may be employed singly or in a combination of two or more kinds. Among these, particularly preferred is a compound having three or more isocyanate groups in a molecule.

In the method of including the electron donating colorless dye in the microcapsules, the organic solvent to be used for dissolving the electron donating colorless dye may be solid or liquid at the normal temperature, or a polymer, and can be a low-boiling auxiliary solvent such as an acetate ester, methylene chloride or cyclohexane, and/or a phosphoric acid ester, a phthalic acid ester, an acrylic acid ester, a methacrylic acid ester, another carboxylic acid ester, a fatty acid amide, an alkylated biphenyl, an alkylated terphenyl, an alkylated naphthalene, a diarylethane, a chlorinated parafin, an alcoholic solvent, a phenolic solvent, an ether solvent, a monoolefin solvent, or an epoxy solvent. Specific examples include high-boiling oils such as tricresyl phosphate, trioctyl phosphate, octyldiphenyl phosphate, tricyclohexyl phosphate, dibutyl phthalate, dioctyl phthalate, dilauryl phthalate, dicyclohexyl phthalate, butyl olefinate, diethylene glycol benzoate, dioctyl sebacate, dibutyl sebacate, dioctyl agipate, trioctyl trimellitate, acetyltriethyl citrate, octyl maleate, dibutyl maleate, isoamylbiphenyl, chlorinated parafin, diisopropylnaphthalene, 1,1'-ditolylethane, 2,4-ditertiary-amylphenol, N,N-dibutyl-2-butoxy-5-tertiary-octylaniline, hydroxybenzoic acid 2-ethylhexyl ester, and polyethylene glycol. These solvents may be used singly or in a combination of two or more kinds. Among these, particularly preferred are an alcohol, a phosphoric acid ester, a carboxylic acid ester, an alkylated biphenyl, an alkylated terphenyl, an alkylated naphthalene and a diarylethane.

Also the water-soluble polymer for dispersing the oil phase of the microcapsules into the aqueous phase can be, for example, polyvinyl alcohol, silanol-denatured polyvinyl alcohol, carboxy-denatured polyvinyl alcohol, amino-denatured polyvinyl alcohol, itaconic acid-denatured polyvinyl alcohol, a styrene-maleic anhydride copolymer, a butadiene-maleic anhydride copolymer, an ethylene-maleic anhydride copolymer, an isobutylene-maleic anhydride copolymer, polyacrylamide, polyethylenesulfonic acid, polyvinylpyrrolidone, an ethylene-acrylic acid copolymer or gelatin.

A method of including the diazonium salt compound or the like in the microcapsules is similar to that employed for microencapsulating the electron donating colorless dye.

A particle size of the microcapsules is preferably within a range of 0.1 to 5.0 $\mu$m, more preferably 0.2 to 2.0 $\mu$m.

In case the thermal recording layer of the invention is constructed with a multi-layered structure, a multi-color thermal recording material can be obtained by employing different colors in such recording layers. The layer configuration is not particularly restricted, and can be suitably selected according to the purpose, but there is preferred, in the present invention, laminated multi-color thermal recording layers having two recording layers in which two diazonium salt compounds having different photosensitive wavelengths are respectively combined with couplers capable of developing different colors by reaction under heating with the respective diazonium salt compounds, and a thermal recording layer in which an electron donating colorless dye and an electron accepting compound are combined. More specifically there is preferred a multi-color thermal recording material in which laminated are, on a support to be explained later, a thermal recording layer A including an electron donating colorless dye and an electron accepting compound, a thermal recording layer B-1 including a diazonium salt compound having a maximum absorption wavelength at 360±20 nm and a coupler capable of developing a color by reaction under heating with the diazonium salt compound, and a thermal recording layer B-2 including a diazonium salt compound having a maximum absorption wavelength at 400±20 nm and a coupler capable of developing a color by reaction under heating with the diazonium salt compound, in this order.

Recording in such multi-color thermal recording material is executed as follows. At first the thermal recording layer B-2 is heated to execute a color development by the diazonium salt compound and the coupler in such layer B-2. Then, after an irradiation with the light of a wavelength of 400±20 nm to decompose the unreacted diazonium salt compound contained in the thermal recording layer B-2, there is added a heat sufficient for color development in the thermal recording layer B-1, thereby causing a color development by the diazonium salt compound and the coupler included in such layer B-1. At the same time the thermal recording layer B-2 is also strongly heated, but no further color development takes place because the diazonium salt compound is already decomposed and the color developing ability is lost. Then an irradiation with the light of a wavelength of 360±20 nm is executed to decompose the diazonium salt compound included in the thermal recording layer B-1, and there is added a heat sufficient for color development in the thermal recording layer A, thereby developing a color therein. At the same time the thermal recording layers B-2 and B-1 are also strongly heated, but no further color development takes place because the diazonium salt compounds are already decomposed so that the color developing ability is lost.

In such multi-color thermal recording layer, a full-color image recording is possible by selecting three primary colors in the subtractive color mixing, namely yellow, magenta and cyan, for the color hues to be developed in these recording layers.

In the thermal recording material of the invention, there is preferred an embodiment including an optical transmittance regulating layer, a protective layer and an intermediate layer, in addition to a single thermal recording layer or plural thermal recording layers on the support.

Optical Transmittance Regulating Layer

An optical transmittance regulating layer contains an ultraviolet absorber precursor, which does not function as an ultraviolet absorber prior to the irradiation with the light of a wavelength region required for fixation, so that the layer shows a high optical transmittance thereby sufficiently transmitting the light of the wavelength region required for fixation at the fixation of a photo-fixable thermal recording layer, and also shows a high optical transmittance in the visible region thereby not hindering the fixation of the thermal recording layer. Such ultraviolet absorber precursor is preferably included in microcapsules.

A compound to be included in the optical transmittance regulating layer can be those described in JP-A No. 9-1928.

After the irradiation with the light of the wavelength region required for the fixation of the thermal recording layer by the light irradiation, the ultraviolet absorber precursor becomes functionable by reacting on light or heat as an ultraviolet absorber, which absorbs most of the light of the ultraviolet wavelength region required for the fixation thereby reducing the transmittance and improving the light fastness of the thermal recording material, but the transmittance for the visible light remains substantially unchanged because of the absence of an absorbing effect for the visible light.

The optical transmittance regulating layer is preferably provided in at least one layer in the thermal recording material, and most preferably provided between a thermal recording layer and a protective layer constituting an outermost layer, but the optical transmittance regulating layer may also be so constructed as to serve as a protective layer. Characteristics of the optical transmittance regulating layer can be arbitrarily selected according to the characteristics of the thermal recording layer.

A coating liquid for forming the optical transmittance regulating layer (optical transmittance regulating layer coating liquid) can be obtained by mixing the components explained in the foregoing. The optical transmittance regulating layer can be obtained by coating such coating liquid with a known coating method such as a bar coating, an air knife coating, a blade coating or a curtain coating. The optical transmittance regulating layer may be coated simultaneously with the thermal recording layer, or coated and formed on the thermal recording layer after a coating liquid for forming the thermal recording layer is coated and dried. A solid coating amount of the optical transmittance regulating layer is preferably within a range of 0.8 to 4.0 g/m$^2$.

Intermediate Layer

In case the thermal recording layer of the invention is formed with a laminated structure of thermal recording layers of different colors, for the purpose of preventing color mixing between such thermal recording layers, an intermediate layer may be provided between the thermal recording layers. Such intermediate layer is not particularly limited and can be formed for example with a water-soluble polymer compound. For such water-soluble polymer compound there can be advantageously employed, for example, polyvinyl alcohol, denatured polyvinyl alcohol, methyl cellulose, sodium polystyrenesulfonate, a styrene-maleic acid copolymer, gelatin and/or a gelatin derivative, or polyethylene glycol and/or a polyethylene glycol derivative.

In the intermediate layer, there may be advantageously added an inorganic layer-structured compound. An intermediate layer including the inorganic layer-structured compound suppresses and prevents a material transfer between the layers thereby preventing color mixing, and also suppresses a supply of oxygen, thereby improving the storability of an unused recording material and the developed color image.

Protective Layer

In the thermal recording material of the invention, a protective layer may be provided on the thermal recording layer according to the necessity. Such protective layer may also be laminated in two or more layers, according to the necessity. A binder to be advantageously used in the protective layer can be, for example, denatured polyvinyl alcohol (silanol-denatured polyvinyl alcohol, long-chain alkylether-denatured polyvinyl alcohol, acetacetyl-denatured polyvinyl alcohol, carboxy-denatured polyvinyl alcohol or the like), a polyvinyl alcohol silicone-denatured polymer, carboxymethyl cellulose, or hydroxyethyl cellulose, and such compounds may be used singly or in a combination of two or more kinds.

The protective layer preferably contains a pigment. Such pigment is preferably inorganic ultra fine particles, which can be, for example, colloidal silica, zirconium oxide, barium sulfate, aluminum oxide (alumina), zinc oxide, magnesium oxide, calcium oxide, cerium oxide or titanium oxide, and these materials may be used singly or in a combination of two or more kinds.

The protective layer is preferably formed by coating and drying a protective layer coating liquid, containing silanol-denatured polyvinyl alcohol and colloidal silica, on the thermal recording layer with an apparatus such as a bar coater, an air knife coater, a blade coater or a curtain coater. The protective layer may be coated simultaneously with the thermal recording layer by a superposed coating method, or may be coated on the thermal recording layer after the thermal recording layer is coated and once dried. The protective layer preferably has a solid coating amount from 0.1 to 3 g/m$^2$, more preferably from 0.3 to 2.0 g/m$^2$. An excessively large coating amount significantly deteriorates the thermal sensitivity, while an excessively small coating amount cannot provide functions (friction resistance, lubricating property, scratch resistance and the like) as the protective layer. After the coating of the protective layer, there may be applied a calendering process if necessary.

Support

The support to be employed in the invention can be, for example, a polyester film such as a polyethylene terephthalate film or a polybutylene terephthalate film, a cellulose derivative film such as a cellulose triacetate film, a polyolefin film such as a polystyrene film, a polypropylene film or a polyethylene film, a plastic film such as a polyimide film, a polyvinyl chloride film, a polyvinylidene chloride film, a polyacrylate copolymer film or a polycarbonate film, paper, synthetic paper or paper having a plastic resin layer, and there is preferred a support having a layer of the above-mentioned plastic film. These films may be transparent or may be opaque, and may be used singly or in a combination of two or more kinds.

Such support having the plastic layer is advantageously a base paper having, on both surface thereof or at least on a surface thereof on which a recording layer is to be formed, a layer formed by a thermoplastic resin, and can be, for example, (1) a base paper on which a thermoplastic resin is coated by melt extrusion, (2) a base paper having a melt extruded thermoplastic resin on which a gas barrier layer is coated, (3) a base paper adhered to a plastic film of a low oxygen permeability, (4) a base paper adhered to a plastic film on which a thermoplastic resin is coated by melt extrusion, or (5) a base paper coated with a thermoplastic resin by melt extrusion, and then adhered with a plastic film.

The thermoplastic resin to be melt extrusion coated on the base paper can advantageously be an olefinic polymer for example a single polymer of alpha-olefin such as polyethylene or polypropylene or a mixture of such polymers, or a random copolymer of ethylene and vinyl alcohol. The polyethylene mentioned above can be, for example, low density polyethylene (LDPE), high density polyethylene (HDPE), or linear low density polyethylene (L-LDPE).

A method of adhering the plastic film to the base paper is not particularly limited, and can be suitably selected from known lamination methods such as those described in *Shin-laminate Kako Binran* (New lamination work handbook) (edited by Kako Gijutsu Kenkyuukai), and advantageous examples include so-called dry lamination, solventless dry lamination, dry lamination utilizing an electron beam- or ultraviolet-curable resin, or hot dry lamination.

Among the supports mentioned in the foregoing, there is particularly preferred in the invention is a base paper formed with natural pulp and coated on both surfaces with an olefinic polymer.

EXAMPLES

In the following, the thermal recording material of the present invention will be further clarified by examples, but the invention is not limited by such examples. In the following description, "part" and "%" respectively mean "part by mass" and "mass %", unless otherwise specified.

Example 1

<Preparation of Phthalated Gelatin Solution>

32 parts of phthalated gelatin (trade name: MGP gelatin, manufactured by Nippi Collagen Co.), 0.9143 parts of 1,2-benzothiazolin-3-one (3.5% methanol solution, manufactured by Daito Chemical Industries, Co.), and 367.1 parts of ion-exchanged water were mixed and dissolved at 40° C. to obtain an aqueous solution of phthalated gelatin.

<Preparation of Alkali-processed Gelatin Solution>

25.5 parts of alkali-processed low-ion gelatin (trade name: #750 gelatin, manufactured by Nitta Gelatin Co.), 0.7286 parts of 1,2-benzothiazolin-3-one (3.5% methanol solution, manufactured by Daito Chemical Industries, Co.), 0.153 parts of calcium hydroxide and 143.6 parts of ion-exchanged water were mixed and dissolved at 50° C. to obtain an aqueous alkali-processed gelatin solution for preparing an emulsion.

(1) Preparation of Coating Liquid for Yellow Recording Layer

<Preparation of Microcapsule Liquid (a) Including Diazonium Salt Compound>

In 16.1 parts of ethyl acetate, 2.2 parts of a following diazonium compound (A) (maximum absorption wavelength 420 nm), 2.2 parts of a following diazonium compound (B) (maximum absorption wavelength 420 nm), 4.8 parts of monoisopropylbiphenyl, 4.8 parts of diphenyl phthalate and 0.4 parts of diphenyl-(2,4,6-trimethylbenzoyl) phosphin oxide (trade name: Lucirin TPO, manufactured by BASF Japan Co.) were added and dissolved uniformly by heating at 40° C. To thus obtained mixture liquid, 10.2 parts of a mixture of xylylene diisocyanate/trimethylolpropane addition product and xylylene diisocyanate/bisphenol A addition product (trade name: Takenate D119N (50% solution in ethyl acetate), manufactured by Takeda Chemical Industries, Ltd.) were added as a capsule wall material and were uniformly agitated to obtain a mixture liquid (I).

Separately, 45.8 parts of the above-mentioned phthalated gelatin aqueous solution were added with 16.3 parts of ion-exchanged water and 0.34 parts of Scraph AG-8 (50%; manufacture by Nippon Seika Co.) to obtain a mixture liquid (II).

The mixture liquid (I) was added to the mixture liquid (II), and was dispersed and emulsified with a homogenizer (manufactured by Nippon Seiki Mfg. Co.) at 40° C. The obtained emulsion was added and mixed uniformly with 20 parts of water, and was subjected to an encapsulation reaction for 3 hours under agitation at 40° C. thereby eliminating ethyl acetate. Thereafter 4.1 parts of ion exchange resin Amberlite IRA68 (manufactured by Organo Corp.) and 8.2 parts of Amberlite IRC50 (manufactured by Organo Corp.) were added and the mixture was agitated further for 1 hour. Thereafter the ion exchange resin was eliminated by filtration, and the capsule liquid was subjected to an adjustment of concentration so as to obtain a solid content of 20.0%, thereby obtaining a microcapsule liquid (a) including the diazonium salt compound. The obtained microcapsules had a median diameter of 0.36 μm, as a result of a particle size measurement with LA-700 (manufactured by Horiba Mfg. Co.).

Diazonium salt compound (A)

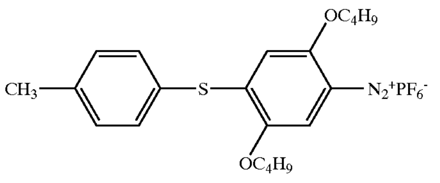

Diazonium salt compound (B)

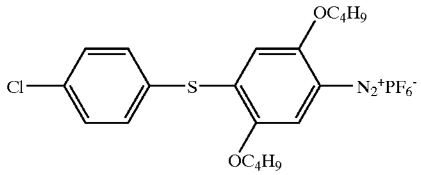

<Preparation of Coupler Compound Emulsion (a)>

In 33.0 parts of ethyl acetate, there were dissolved 9.9 parts of a following coupler compound (C), 9.9 parts of triphenylguanidine (manufactured by Hodogaya Chemical Co.), 20.8 parts of 4,4'-(m-phenylenediisopropylidene)-diphenol (trade name: Bisphenol M, manufactured by Mitsui Petrochemicals Inc.), 3.3 parts of 3,3,3',3'-tetramethyl-5,5',6,6'-tetra(1-propyloxy-1,1'-spirobisindane, 13.6 parts of 4-(2-ethylhexyloxy)benzenesulfonic acid amide (manufactured by Manac Co.), 6.8 parts of 4-n-pentyloxybenzene-sulfonic acid amide (manufactured by Manac Co.) and 4.2 parts of calcium dodecylbenzenesulfonate (trade name: Pionin A-41-C (70% methanol solution), manufactured by Takemoto Yushi Co.) to obtain a mixture liquid (III).

Separately, 206.3 parts of the above-mentioned alkali-processed gelatin aqueous solution were mixed with 107.3 parts of ion-exchanged water to obtain a mixture liquid (IV).

The mixture liquid (IV) was added to the mixture liquid (III), and was dispersed and emulsified with a homogenizer (manufactured by Nippon Seiki Mfg. Co.) at 40° C. The obtained emulsion of the coupler compound was heated under a reduced pressure to eliminate ethyl acetate, and was subjected to an adjustment of concentration so as to obtain a solid content of 26.5%. The obtained emulsion of the coupler compound had a median diameter of 0.21 μm, as a result of a particle size measurement with LA-700 (manufactured by Horiba Mfg. Co.).

Then, 9 parts of SBR latex (trade name: SN-307 (48% liquid, manufactured by Sumika ABS Latex Co.), adjusted to a concentration of 26.5%, were added to 100 parts of the aforementioned emulsion of coupler compound and were uniformly agitated to obtain an emulsion (a) of the coupler compound.

Coupler compound (C)

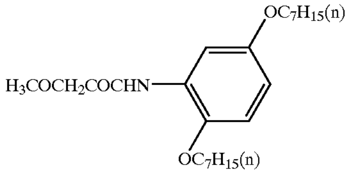

<Preparation of Coating Liquid (a)>

The microcapsule liquid (a) including the diazonium salt compound and the emulsion (a) of the coupler compound were mixed in such a manner that the mass ratio of the included coupler compound/diazonium compound becomes 2.2/1, thereby obtaining a coating liquid (a) for the thermal recording layer.

(2) Preparation of Coating Liquid for Magenta Recording Layer

<Preparation of Microcapsule Liquid (b) Including Diazonium Compound>

In 15.1 parts of ethyl acetate, 2.8 parts of a following diazonium compound (D) (maximum absorption wavelength 365 nm), 3.8 parts of diphenyl phthalate, 3.9 parts of phenyl 2-benzoyloxybenzoate, 4.2 parts of a following ester compound (trade name: Light Ester TMP, manufactured by Kyoei Yushi Kagaku Co.) and 0.1 parts of calcium dodecylbenzenesulfonate (trade name: Pionin A-41-C, 70% methanol solution, manufacture by Takemoto Yushi Co.) were added and uniformly dissolved under heating. To thus obtained mixture liquid, 2.5 parts of a mixture of xylylene diisocyanate/trimethylolpropane addition product and xylylene diisocyanate/bisphenol-A addition product (trade name: Takenate D119N (50% ethyl acetate solution), manufactured by Takeda Chemical Industries, Ltd.) and 6.8 parts of a xylylene diisocyanate/trimethylolpropane addition product (trade name: Takenate D110N (75% ethyl acetate solution) manufactured by Takeda Chemical Industries, Ltd.) were added as a capsule wall material and uniformly agitated to obtain a mixture liquid (V).

Separately, 48.9 parts of the above-mentioned phthalated gelatin aqueous solution were added with 21.0 parts of ion-exchanged water to obtain a mixture liquid (VI).

The mixture liquid (V) was added to the mixture liquid (VI), and was dispersed and emulsified with a homogenizer (manufactured by Nippon Seiki Mfg. Co.) at 40° C. The obtained emulsion was added and mixed uniformly with 24 parts of water, and was subjected to an encapsulation reaction for 3 hours under agitation at 40° C. thereby eliminating ethyl acetate. Thereafter 4.1 parts of ion exchange resin Amberlite IRA68 (manufactured by Organo Corp.) and 8.2 parts of Amberlite IRC50 (manufactured by Organo Corp.) were added and the mixture was agitated further for 1 hour. Thereafter the ion exchange resin was eliminated by filtration, and the capsule liquid was subjected to an adjustment of concentration so as to obtain a solid content of 20.0%, thereby obtaining a microcapsule liquid (b) including the diazonium salt compound. The obtained microcapsules had a median diameter of 0.43 μm, as a result of a particle size measurement with LA-700 (manufactured by Horiba Mfg. Co.).

Diazonium salt compound (D)

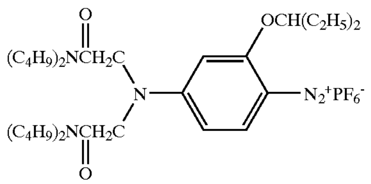

Ester compound

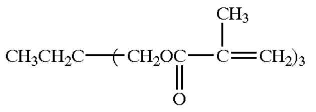

<Preparation of Coupler Compound Emulsion (b)>

In 36.9 parts of ethyl acetate, there were dissolved 10.2 parts of a following coupler compound (E), 14.0 parts of triphenylguanidine (manufactured by Hodogaya Chemical Co.), 14.0 parts of 4,4'-(m-phenylenediisopropylidene)-diphenol (trade name: Bisphenol M, manufactured by Mitsui Petrochemicals Inc.), 14 parts of 1,1-(p-hydroxyphenyl)-2-ethylhexane, 3.5 parts of 3,3,3',3'-tetramethyl-5,5',6,6'-tetra (1-propyloxy)-1,1'-spirobisindane, 3.5 parts of a following compound (G), 1.7 parts of tricresyl phosphate, 0.8 parts of diethyl maleate, and 4.5 parts of calcium dodecylbenzenesulfonate (trade name: Pionin A-41-C (70% methanol solution), manufactured by Takemoto Yushi Co.) to obtain a mixture liquid (VII).

Separately, 206.3 parts of the above-mentioned alkali-processed gelatin aqueous solution were mixed with 107.3 parts of ion-exchanged water to obtain a mixture liquid (VIII).

The mixture liquid (VII) was added to the mixture liquid (VIII), and was dispersed and emulsified with a homogenizer (manufactured by Nippon Seiki Mfg. Co.) at 40° C. The obtained emulsion of the coupler compound was heated under a reduced pressure to eliminate ethyl acetate, and was subjected to an adjustment of concentration so as to obtain a solid content of 24.5%, thereby obtaining a emulsion (b) including the coupler compound. The obtained emulsion of the coupler compound had a median diameter of 0.22 μm, as a result of a particle size measurement with LA-700 (manufactured by Horiba Mfg. Co.).

Coupler compound (E)

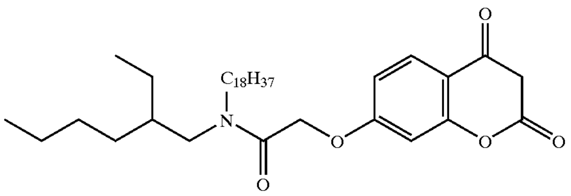

Compound (G)

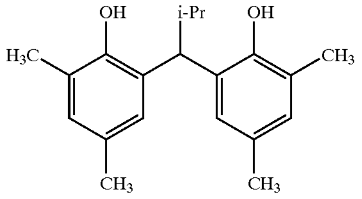

<Preparation of Coating Liquid (b)>

The microcapsule liquid (b) including the diazonium salt compound and the emulsion (b) of the coupler compound were mixed in such a manner that the mass ratio of the included coupler compound/diazonium compound becomes 3.5/1. Also an aqueous solution (5%) of polystyrenesulfonic acid (partially neutralized with potassium hydroxide) was mixed in an amount of 0.2 parts with respect to 10 parts of the capsule liquid, thereby obtaining a coating liquid (b) for the thermal recording layer.

(3) Preparation of Coating Liquid for Cyan Recording Layer

<Preparation of Microcapsule Liquid (c) Including Electron Donating Dye Precursor>

In 18.1 parts of ethyl acetate, 7.6 parts of a following electron donating dye (H), 10 parts of a mixture of 1-methylpropylphenyl-phenylmethane and 1-(1-methylpropylphenyl)-2-phenylethane (trade name: Hisol SAS-310, manufactured by Japan Petroleum Co.) and 8.0 parts of a following compound (I) (trade name; Irgaperm 2140, manufactured by Ciba-Geigy Inc.) were added and uniformly dissolved under heating. To thus obtained mixture liquid, 7.2 parts of a xylylene diisocyanate/trimethylolpropane addition product (trade name: Takenate D110N (75% ethyl acetate solution) manufactured by Takeda Chemical Industries, Ltd.) and 5.3 parts of polymethylene polyphenyl polyisocyanate (trade name: Millionate MR-200, manufactured by Nippon Polyurethane Industries, Ltd.) were added as a capsule wall material and uniformly agitated to obtain a mixture liquid (IX).

Separately, 28.8 parts of the above-mentioned phthalated gelatin aqueous solution were added with 9.5 parts of ion-exchanged water, 0.17 parts of Scraph AG-8 (50%; manufacture by Nippon Seika Co.), and 4.3 parts of sodium dodecylbenzenesulfonate (10% aqueous solution) to obtain a mixture liquid (X).

The mixture liquid (IX) was added to the mixture liquid (X), and was dispersed and emulsified with a homogenizer (manufactured by Nippon Seiki Mfg. Co.) at 40° C. The obtained emulsion was added and mixed uniformly with 50 parts of water and 0.12 parts of tetraethylene pentamine, and was subjected to an encapsulation reaction for 3 hours under agitation at 65° C. thereby eliminating ethyl acetate, and the concentration was so adjusted to obtain a solid concentration of 33% in the liquid, thereby obtaining a microcapsule liquid. The obtained microcapsules had a median diameter of 1.00 μm, as a result of a particle size measurement with LA-700 (manufactured by Horiba Mfg. Co.).

Then 100 parts of the microcapsule liquid were added with 1.8 parts of a 25% aqueous solution of sodium dodecylbenzenesulfonate (trade name: Neopelex F-25, manufactured by Kao Corp.), and further with 4.3 parts of a fluorescent whitening agent containing a 4,4'-bistriazinylaminostylbene-2,2'-disulfon derivative (trade name: Kaycoll BXNL, manufactured by Nippon Soda Co.) and uniformly agitated to obtain a microcapsule dispersion (c).

Electron donating dye (H)

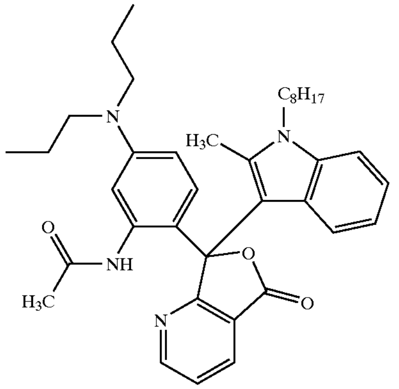

Compound (I)

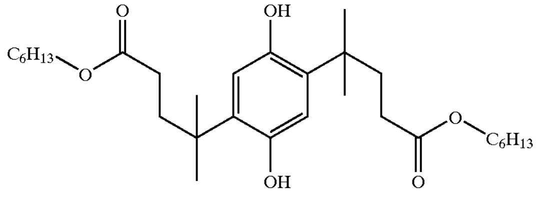

<Preparation of Electron Accepting Compound Dispersion (c)>

11.3 parts of the phthalated gelatin aqueous solution were added with 30.1 parts of ion-exchanged water, 15 parts of the aforementioned example compound 1 and 3.8 parts of a 2% aqueous solution of sodium 2-ethylhexylsuccinate and were dispersed overnight with a ball mill to obtain a dispersion. The dispersion had a solid content of 26.6%.

100 parts of the dispersion were added with 45.2 parts of the alkali-processed gelatin aqueous solution, then agitated for 30 minutes, and were added with ion-exchanged water so as to obtain a solid content of 23.5% thereby obtaining a dispersion (c) of the electron accepting compound.

<Preparation of Coating Liquid (c)>

The microcapsule liquid (c) including the electron donating dye precursor and the emulsion (c) of the electron accepting compound were mixed in such a manner that the mass ratio of the electron accepting compound/electron donating dye precursor becomes 10/1, thereby obtaining a coating liquid (c).

(4) Preparation of Coating Liquid for Intermediate Layer 100.0 parts of alkali-processed low-ion gelatin (trade name: #750 gelatin, manufactured by Nitta Gelatin Co.), 1.025 parts of 1,2-benzothiazolin-3-one (3.5% methanol solution, manufactured by Daito Chemical Industries, Co.), 0.5 parts of calcium hydroxide and 521.643 parts of ion-exchanged water were mixed and dissolved at 50° C. to obtain an aqueous gelatin solution for preparing an intermediate layer.

10.0 parts of the gelatin aqueous solution for preparing the intermediate layer, 0.05 parts of sodium (4-nonylphenoxytrioxyethylene)butylsulfonate (2.0% aqueous solution, manufactured by Sankyo Chemicals Co.), 1.5 parts of boric acid (4.0% aqueous solution), 0.19 parts of an aqueous solution (5%) of polystyrenesulfonic acid (partially neutralized with potassium hydroxide), 3.42 parts of a 4% aqueous solution of a following compound (J) (manufactured by Wako Pure Chemical Co.), 1.13 parts of a 4% aqueous solution of a following compound (J') (manufactured by Wako Pure Chemical Co.) and 0.67 parts of ion-exchanged water were mixed to obtain a coating liquid for the intermediate layer.

Compound (J)

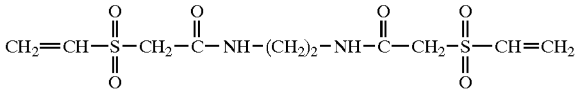

Compound (J')

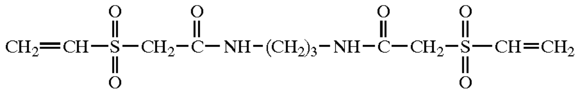

(5) Preparation of Coating Liquid for Optical Transmittance Regulating Liquid

<Preparation of Microcapsule Liquid of Ultraviolet Absorber Precursor>

In 71 parts of ethyl acetate, there were uniformly dissolved 14.5 parts of [2-allyl-6-(2H-benzotriazol-2-yl)-4-t-octylphenyl]benzenesulfonate as an ultraviolet absorber precursor, 5.0 parts of 2,2'-t-octylhydroquinone, 6 parts of tricresyl phosphate, 10 parts of α-methylstyrene dimer (trade name: MSD-100, manufactured by Mitsui Chemicals Inc.), and 0.45 parts of calcium dodecylbenzenesulfonate (trade name: Pionin A-41-C, 70% methanol solution manufactured by Takemoto Yushi Co.). In this mixture liquid, there were added 54.7 parts of a xylylene diisocyanate/trimethylolpropane addition product (trade name: Takenate D110N (75% ethyl acetate solution), manufacture by Takeda Chemical Industries Ltd.) as a capsule wall material, and the mixture was uniformly agitated to obtain a mixture liquid of the ultraviolet absorber precursor.

Separately, 52 parts of itaconic acid-denatured polyvinyl alcohol (trade name: KL-318, manufactured by Kuraray Co.) were mixed with 8.9 parts of a 30% aqueous solution of phosphoric acid, and 532.6 parts of ion-exchanged water to obtain a polyvinyl alcohol (PVA) aqueous solution for a microcapsule liquid of the ultraviolet absorber precursor.

The mixture liquid of the ultraviolet absorber precursor was added to 516.06 parts of the aqueous PVA solution for the ultraviolet absorber precursor microcapsule liquid, and was dispersed and emulsified with a homogenizer (manufactured by Nippon Seiki Mfg. Co.) at 20° C. The obtained emulsion was added and mixed uniformly with 254.1 parts of ion-exchanged water, and was subjected to an encapsulation reaction for 3 hours under agitation at 40° C. Thereafter 94.3 parts of ion exchange resin Amberlite MB-3 (manufactured by Organo Corp.) were added and the mixture was agitated further for 1 hour. Thereafter the ion exchange resin was eliminated by filtration, and the capsule liquid was subjected to an adjustment of concentration so as to obtain a solid content of 13.5%. The obtained microcapsules had a median diameter of 0.23±0.05 μm, as a result of a particle size measurement with LA-700 (manufactured by Horiba Mfg. Co.). 859.1 parts of the microcapsule liquid were mixed with 2.416 parts of carboxy-denatured styrene-butadiene latex (trade name: SN-307 (48% aqueous solution), manufactured by Sumitomo Naugatac Co., Ltd.) and 39.5 parts of ion-exchanged water to obtain a microcapsule liquid of the ultraviolet absorber precursor.

<Preparation of Coating Liquid for Optical Transmittance Regulating Layer>

1000 parts of the microcapsule liquid of the ultraviolet absorber precursor, 5.2 parts of a fluorinated surfactant (trade name: Megafac F-120, 5% aqueous solution, manufactured by Dai-Nippon Inks and Chemicals Industries, Ltd.), 7.75 parts of a 4% aqueous solution of sodium hydroxide and 73.39 parts of sodium (4-nonylphenoxytrioxyethylene)butylsulfonate (2.0% aqueous solution, manufactured by Sankyo Chemicals Co. Ltd.) were mixed to obtain a coating liquid for the optical transmittance regulating layer.

(6) Preparation of Coating Liquid for Protective Layer

<Preparation of Polyvinyl Alcohol Solution for Protective Layer>

160 parts of a vinyl alcohol-alkylvinyl ether copolymer (trade name: EP-130, manufactured by Denka Corp.), 8.74 parts of a mixture liquid of sodium alkylsulfonate and a polyoxyethylene alkylether phosphoric acid ester (trade name: Neoscore CM-57 (54% aqueous solution), manufactured by Toho Chemical Industries, Co.) and 3832 parts of ion-exchanged water were mixed and uniformly dissolved for 1 hour at 90° C. to obtain a polyvinyl alcohol solution for the protective layer.

<Preparation of Pigment Dispersion for Protective Layer>

4 parts of barium sulfate (trade name: BF-21F, barium sulfate content 93% or higher, manufactured by Sakai Chemical Industries, Co.) were mixed with 0.2 parts of an anionic special polycarboxylic acid polymer surfactant (trade name: Poise 532A (40% aqueous solution), manufactured by Kao Corp.) and 11.8 parts of ion-exchanged water and were dispersed in a Dyno mill to prepare a barium sulfate dispersion. The dispersion had a median diameter of 0.15 μm or less as a result of a particle size measurement with LA-910 (manufactured by Horiba Mfg. Co.).

45.6 parts of the above-mentioned barium sulfate dispersion were added with 8.1 parts of colloidal silica (trade name: Snowtex-O (20% aqueous dispersion), manufactured by Nissan Chemicals Inc.) to obtain a desired pigment dispersion for the protective layer.

<Preparation of Dispersion of Matting Agent for Protective Layer>

220 parts of wheat starch (trade name: Wheat starch S, manufactured by Shinshin Shokuryo Kogyo Co.) were mixed with 3.81 parts of an aqueous dispersion of 1-2-benzisothiazolin-3-one (trade name: PROXEL B.D, manufactured by I.C.I. Ltd.) and 1976.19 parts of ion-exchanged water and were dispersed uniformly to obtain a dispersion of the matting agent for the protective layer.

<Preparation of Coating Liquid for Protective Layer>

1000 parts of the polyvinyl alcohol solution for the protective layer were uniformly mixed with 40 parts of a fluorinated surfactant (trade name: Megafac F-120, 5% aqueous solution, manufactured by Dai-Nippon Inks and Chemicals Industries, Ltd.), 50 parts of sodium (4-nonylphenoxytrioxyethylene)butylsulfonate (2.0% aqueous solution, manufactured by Sankyo Chemicals, Inc.), 49.87 parts of the pigment dispersion for the protective layer, 16.65 parts of the dispersion of the matting agent for the protective layer, and 48.7 parts of a zinc stearate dispersion (trade name: Hydrin F115, 20.5% aqueous solution, manufactured by Chukyo Yushi Co.) to obtain a coating liquid for the protective layer.

<Preparation of Support>

(Preparation of Undercoating Liquid)

40 parts of enzyme-decomposed gelatin (average molecular weight: 10000, viscosity by PAGI method: 1.5 mPa·s, jelly strength by PAGI method: 20 g) were mixed with 60 parts of ion-exchanged water and dissolved under agitation at 40° C. to obtain an aqueous gelatin solution for the undercoat layer.

Separately, 8 parts of water-swellable synthetic mica (aspect ratio: 1000, trade name: Somashif ME100, manufactured by Cope Chemical Inc.) were mixed with 92 parts of water and subjected to wet dispersion in a visco mill to obtain a mica dispersion with an average particle size of 2.0 $\mu$m. The mica dispersion was added with water so as to obtain a mica concentration of 5% and was uniformly mixed to obtain a desired mica dispersion.

To 100 parts of the 40% aqueous gelatin solution for the undercoat layer at 40° C., 120 parts of water and 556 parts of methanol were added and sufficiently mixed under agitation, then 208 parts of the 5% mica dispersion were added and sufficiently mixed under agitation, and 16.0 parts of a 1.66% polyethylene oxide surfactant were added. Then, at a liquid temperature maintained at 35 to 40° C., 7.3 parts of a gelatin hardening agent, formed by an epoxy compound, were added to obtain a coating liquid (5.7%) for the undercoat layer.

(Preparation of Support with Undercoat Layer)

An wood pump, composed of 50 parts of LBPS and 50 parts of LBPK, was beaten with a disk refiner to a Canadian freeness of 300 ml, then added with 0.5 parts of epoxylated behenate amide, 1.0 part of anionic polyacrylamide, 1.0 part of aluminum sulfate, 0.1 parts of polyamidepolyamine epichlorohydrin and 0.5 parts of cationic polyacrylamide, all in absolute dry mass ratios to the pump, and was subjected to a paper making with a long-screen paper mill to form a base paper with a basis weight of 114 g/m$^2$, of which thickness was adjusted to 100 $\mu$m by a calendering process.

After a corona discharge treatment on both surfaces of the base paper, polyethylene was coated with a melt extruder so as to obtain a resin thickness of 36 $\mu$m thereby forming a resin layer of a matted surface (this surface being called a rear surface). Then, on a surface opposite to the surface bearing the above-mentioned resin layer, polyethylene containing titanium oxide of anatase type in 10% and a small amount of Prussian blue was coated with a melt extruder so as to obtain a resin thickness of 50 $\mu$m thereby forming a resin layer with a glossy surface (this surface being called a front surface). On the polyethylene coated rear surface, after a corona discharge treatment, as a static electricity preventing agent aluminum oxide (trade name: Alumina Sol 100, manufactured by Nissan Chemical Industries, Inc.)/silicon dioxide (trade name: Snowtex-O, manufactured by Nissan Chemical Industries, Inc.)=1/2 (mass ratio) were dispersed in water and coated with a dry mass amount of 0.2 g/m$^2$. Then, on the polyethylene coated front surface, after a corona discharge treatment, the above-described undercoating liquid was coated with a coating amount of mica of 0.26 g/m$^2$ to obtain a support with an undercoat layer.

<Coating of Coating Liquid for Each Thermal Recording Layer>

On the support with the undercoat layer, seven layers were simultaneously coated in an order, from the bottom, of the thermal recording layer coating liquid (c), the intermediate layer (intermediate layer A) coating liquid, the thermal recording layer coating liquid (b), the intermediate layer (intermediate layer B) coating liquid, the thermal recording layer coating liquid (a), the coating liquid for the optical transmittance regulating layer, and the coating liquid for the protective layer and were dried under a condition of 30° C. and 30% RH and a condition of 40° C. and 30% RH to obtain a multi-color thermal recording material.

In this operation, the thermal recording layer coating liquid (a) was coated in such a manner that the diazonium compound (A) had a solid coating amount of 0.078 g/m$^2$, the thermal recording layer coating liquid (b) was coated in such a manner that the diazonium compound (D) had a solid coating amount of 0.206 g/m$^2$, and the thermal recording layer coating liquid (c) was coated in such a manner that the electron donating dye (H) included in the liquid had a solid coating amount of 0.355 g/m$^2$.

Also, the intermediate layer B coating liquid was coated so as to have a solid coating amount of 2.39 g/m$^2$ and the intermediate layer A coating liquid was coated so as to have a solid coating amount of 3.34 g/m$^2$, while the coating liquid for the optical transmittance regulating layer was so coated as to have a solid coating amount of 2.35 g/m$^2$, and the coating liquid for the protective layer was so coated as to have a solid coating amount of 1.39 g/m$^2$.

Evaluation (i) Thermal Recording

Thermal recording was executed in the following manner with a thermal head KST (trade name; manufactured by Kyocera Corp.) and an ultraviolet lamp.

A cyan image was obtained by an exposure for 10 seconds under an ultraviolet lamp of a central light emission wavelength of 450 nm and an output of 40 W, then by an exposure for 30 seconds under an ultraviolet lamp of a central light emission wavelength of 365 nm and an output of 40 W, with a final recording energy per unit area of 132 to 171 mJ/mm$^2$.

The obtained cyan concentration of the multi-color thermal recording material was measured with X-rite model 310 (manufactured by X-rite Inc.). Then a weather meter (Ci65; manufactured by Atlas, Inc.) was used to irradiate the multi-color thermal recording material, subjected to the above-mentioned measurement of cyan concentration, with an artificial solar light with an output of 0.9 W/$cm^2$ at a wavelength of 420 nm in continuous manner for 12 days, and the cyan concentration after the continuous irradiation for 12 days was measured in a similar manner as before the irradiation. An image storability was evaluated by an image retention rate (%), which was defined by the cyan color density, multiplied by 100, after the continuous irradiation for 12 days, in a position where the cyan color density was 1.0 prior to the irradiation. The obtained results are shown in Table 3.

Example 2

A multi-color thermal recording material of an example 2 was prepared in a similar manner as in the example 1, except that, in the <preparation of dispersion (c) of electron accepting compound>, the example compound 1 in the example 1 was replaced by the example compound 5, and was evaluated in a similar manner. Obtained results are shown in Table 3.

Example 3

A multi-color thermal recording material of an example 3 was prepared in a similar manner as in the example 1, except that, in the <preparation of dispersion (c) of electron accepting compound>, the example compound 1 in the example 1 was replaced by the example compound 8, and was evaluated in a similar manner. Obtained results are shown in Table 3.

Example 4

A multi-color thermal recording material of an example 4 was prepared in a similar manner as in the example 1, except that, in the <preparation of dispersion (c) of electron accepting compound>, the example compound 1 in the example 1 was replaced by the example compound 9, and was evaluated in a similar manner. Obtained results are shown in Table 3.

Example 5

A multi-color thermal recording material of an example 5 was prepared in a similar manner as in the example 1, except that, in the <preparation of dispersion (c) of electron accepting compound>, the example compound 1 in the example 1 was replaced by the example compound 10, and was evaluated in a similar manner. Obtained results are shown in Table 3.

Example 6

A multi-color thermal recording material of an example 6 was prepared in a similar manner as in the example 1, except that, in the <preparation of dispersion (c) of electron accepting compound>, the example compound 1 in the example 1 was replaced by the example compound 13, and was evaluated in a similar manner. Obtained results are shown in Table 3.

Example 7

A multi-color thermal recording material of an example 7 was prepared in a similar manner as in the example 1, except that, in the <preparation of dispersion (c) of electron accepting compound>, the example compound 1 in the example 1 was replaced by the example compound 15, and was evaluated in a similar manner. Obtained results are shown in Table 3.

Comparative Example 1

A multi-color thermal recording material of a comparative example 1 was prepared in a similar manner as in the example 1, except that, in the <preparation of dispersion (c) of electron accepting compound>, the example compound 1 in the example 1 was replaced by a compound A represented by a following formula, and was evaluated in a similar manner. Obtained results are shown in Table 3:

Compound A

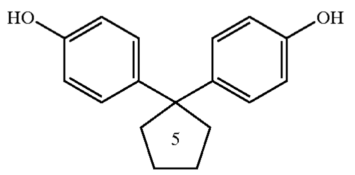

Comparative Example 2

A multi-color thermal recording material of a comparative example 2 was prepared in a similar manner as in the example 1, except that, in the <preparation of dispersion (c) of electron accepting compound>, the example compound 1 in the example 1 was replaced by a compound B represented by a following formula, and was evaluated in a similar manner. Obtained results are shown in Table 3:

Compound B

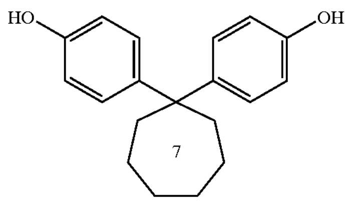

Comparative Example 3

A multi-color thermal recording material of a comparative example 3 was prepared in a similar manner as in the example 1, except that, in the <preparation of dispersion (c) of electron accepting compound>, the example compound 1 in the example 1 was replaced by a compound C represented by a following formula, and was evaluated in a similar manner. Obtained results are shown in Table 3:

Compound C

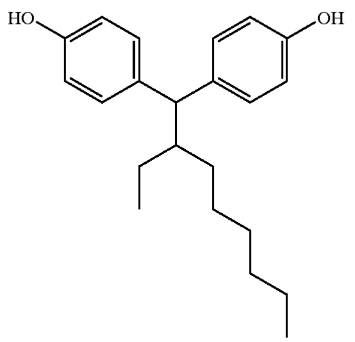

Comparative Example 4

A multi-color thermal recording material of a comparative example 4 was prepared in a similar manner as in the example 1, except that, in the <preparation of dispersion (c) of electron accepting compound>, the example compound 1 in the example 1 was replaced by a compound D represented by a following formula, and was evaluated in a similar manner. Obtained results are shown in Table 3:

Compound D

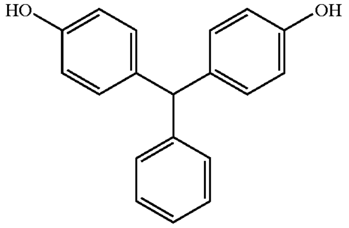

Comparative Example 5

A multi-color thermal recording material of a comparative example 5 was prepared in a similar manner as in the example 1, except that, in the <preparation of dispersion (c) of electron accepting compound>, the example compound 1 in the example 1 was replaced by a compound E represented by a following formula, and was evaluated in a similar manner. Obtained results are shown in Table 3:

Compound E

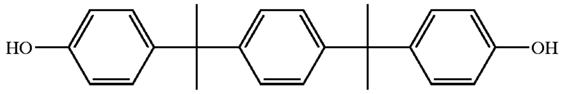

TABLE 3

| | Electron Accepting Compound | Image Retention Rate (%) after Irradiation |
|---|---|---|
| Example 1 | Example Compound 1 | 72 |
| Example 2 | Example Compound 5 | 71 |
| Example 3 | Example Compound 8 | 88 |
| Example 4 | Example Compound 9 | 83 |
| Example 5 | Example Compound 10 | 85 |
| Example 6 | Example Compound 13 | 77 |
| Example 7 | Example Compound 15 | 88 |
| Comp. Ex. 1 | Compound A | 60 |
| Comp. Ex. 2 | Compound B | 58 |
| Comp. Ex. 3 | Compound C | 61 |
| Comp. Ex. 4 | Compound D | 60 |
| Comp. Ex. 5 | Compound E | 58 |

Results in Table 3 indicate that the multi-color thermal recording materials of the examples 1 to 7, utilizing the electron accepting compound represented by the general formula (1) have higher image retention rates after light irradiation, in comparison with the multi-color thermal recording materials of the comparative examples 1 to 5.

Thus, the present invention can provide a thermal recording material excellent in the image storability in a light place.

What is claimed is:

1. A thermal recording material comprising a support and at least a thermal recording layer disposed on the support, wherein at least one thermal recording layer includes, together with an electron donating colorless dye enclosed in microcapsules, at least an electron accepting compound represented by the following general formula (1):

General formula (1)

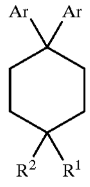

wherein $R^1$ and $R^2$ each independently represents a hydrogen atom or an aryl group, wherein at least one of $R^1$ and $R^2$ is an aryl group which may be substituted by a hydroxyl group or an alkyl group with 1 to 10 carbon atoms; and Ar is represented by the following general formula (2):

General formula (2)

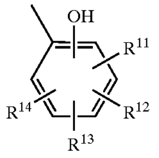

wherein $R^{11}$ to $R^{14}$ each independently represents a hydrogen atom, an alkyl group with 1 to 4 carbon atoms or an aryl group.

2. The thermal recording material according to claim 1, wherein at least one of $R^1$ and $R^2$ in the general formula (1) is a substituent represented by the following general formula (3):

General formula (3)

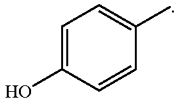

3. The thermal recording material according to claim 1, wherein the compound represented by the general formula (1) is at least one selected from a group consisting of following compounds 8, 9, 10 and 15:

General formula (1)

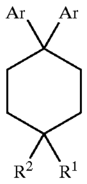

| Compound No. | $R^1$ | $R^2$ | Ar |
|---|---|---|---|
| 8 | —H | 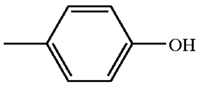 | 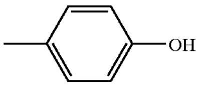 |
| 9 | —H | 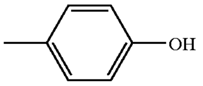 | 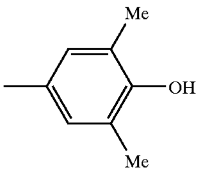 |
| 10 | —H | 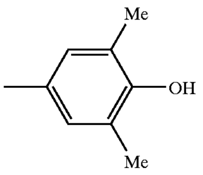 | 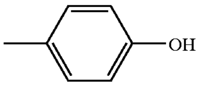 |
| 15 | 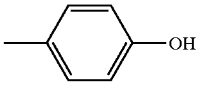 | 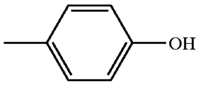 | 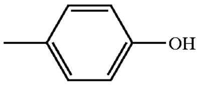 |

4. The thermal recording material according to claim 1, wherein a wall membrane of the microcapsules includes at least one selected from the group consisting of polyurethane resins, polyurea resins, polyamide resins, polyester resins, polycarbonate resins, aminoaldehyde resins, melamine resins, polystyrene resins, styrene-acrylate copolymer resins, styrene-methacrylate copolymer resins, gelatins and polyvinyl alcohols.

5. The thermal recording material according to claim 1, wherein the microcapsules have an average particle size of 0.1 to 5.0 μm.

6. The thermal recording material according to claim 1, wherein the electron donating colorless dye includes at least one selected from the group consisting of a triarylmethane compound, a diphenylmethane compound, a thiazine compound, a xanthene compound and a spiropyran compound.

7. The thermal recording material according to claim 1, wherein the electron donating colorless dye in the thermal recording layer possesses a solid coating amount of 0.01 to 2.0 $g/m^2$.

8. The thermal recording material according to claim 1, wherein the electron accepting compound includes at least one selected from the group consisting of a phenol derivative and a hydroxybenzoic acid ester.

9. The thermal recording material according to claim 1, wherein the electron accepting compound in the thermal recording layer possesses a solid coating amount of 0.5 to 10.0 $g/m^2$.

10. The thermal recording material according to claim 1, comprising at least one photo-fixable thermal recording layer disposed on the support, said photo-fixable thermal recording layer including a diazonium salt compound, a diazo color developing agent including a coupler capable of a coupling reaction with said diazonium salt compound, and a binder.

11. The thermal recording material according to claim 10, wherein the diazonium salt compound is enclosed in microcapsules.

12. The thermal recording material according to claim 11, wherein a wall membrane of the microcapsules enclosing the diazonium salt compound includes at least one selected from the group consisting of polyurethane resins, polyurea resins, polyamide resins, polyester resins, polycarbonate resins, aminoaldehyde resins, melamine resins, polystyrene resins, styrene-acrylate copolymer resins, styrene-methacrylate copolymer resins, gelatins and polyvinyl alcohols.

13. The thermal recording material according to claim 11, wherein the microcapsules enclosing the diazonium salt compound have an average particle size of 0.1 to 5.0 μm.

14. The thermal recording material according to claim 10, wherein the photo-fixable thermal recording layer further includes a basic substance.

15. The thermal recording material according to claim 1, further comprising, on the support, at least one each of an optical transmittance regulating layer, a protective layer and an intermediate layer.

16. The thermal recording material according to claim 15, wherein the optical transmittance regulating layer includes an ultraviolet absorber precursor.

17. The thermal recording material according to claim 15, wherein the intermediate layer includes at least one selected from the group consisting of polyvinyl alcohols, denatured polyvinyl alcohols, methyl cellulose, sodium polystyrenesulfonate, styrene-maleic acid copolymers, gelatins, gelatin derivatives, polyethylene glycols and polyethylene glycol derivatives.

18. The thermal recording material according to claim 15, wherein the protective layer includes at least one selected from the group consisting of denatured polyvinyl alcohols, silicone-denatured polyvinyl alcohol polymers, carboxylmethyl cellulose and hydroxyethyl cellulose.

19. The thermal recording material according to claim 3, wherein the support has at least one in a layer form selected from the group consisting of a polyester film, a cellulose derivative film, a polyolefin film, a polyimide film, a polyvinyl chloride film, a polyvinylidene chloride film, a polyacrylic acid copolymer film, a polycarbonate film, paper and synthetic paper.

20. The thermal recording material according to claim 3, wherein the compound represented by the general formula (1) is at least one selected from a group consisting of the following compound 8 and 15.

* * * * *